US010732681B2

(12) United States Patent
Dan et al.

(10) Patent No.: US 10,732,681 B2
(45) Date of Patent: Aug. 4, 2020

(54) ADAPTIVE AIRFLOW GUIDES IN AN ELECTRONIC DEVICE

(71) Applicant: Microsoft Technology Licensing, LLC, Redmond, WA (US)

(72) Inventors: Bo Dan, Redmond, WA (US); Robert Ullman Myers, Kirkland, WA (US); James Hao-An Chen Lin, Seattle, WA (US); Andrew William Hill, Redmond, WA (US); Han Li, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/046,875

(22) Filed: Jul. 26, 2018

(65) Prior Publication Data

US 2020/0033919 A1    Jan. 30, 2020

(51) Int. Cl.
*G05B 15/02* (2006.01)
*G06F 1/20* (2006.01)
*H05K 7/20* (2006.01)

(52) U.S. Cl.
CPC ............. *G06F 1/206* (2013.01); *G05B 15/02* (2013.01); *H05K 7/20145* (2013.01); *H05K 7/20154* (2013.01); *H05K 7/20172* (2013.01)

(58) Field of Classification Search
CPC .... F04D 27/002; F04D 27/004; F04D 29/462; G05B 15/02; G06F 1/206;
(Continued)

(56) References Cited

U.S. PATENT DOCUMENTS 6,222,729 B1    4/2001    Yoshikawa
7,447,028 B2    11/2008    Lai et al.
(Continued)

FOREIGN PATENT DOCUMENTS

GB    2424522 A    9/2006

OTHER PUBLICATIONS

"International Search Report and Written Opinion Issued in PCT Application No. PCT/US19/038076", dated Sep. 13, 2019, 16 Pages.

*Primary Examiner* — Abdelmoniem I Elamin
(74) *Attorney, Agent, or Firm* — NovoTechIP International PLLC

(57) ABSTRACT

Thermal management devices and systems, and corresponding methods of cooling computing devices are described herein. Such devices, systems, and methods may be advantageous in providing optimal thermal management for the computing device and/or minimizing acoustics in the computing device for a plurality of rotational fan speeds. Additionally, optimal thermal management may provide an increase in system performance and an increase in computing device life expectancy. In one example, a thermal management system includes a fan configured to move air through an outlet opening of the fan and at least one airflow guide positioned adjacent to the outlet opening. The at least one airflow guide is configured to direct movement of the air from the outlet opening to dissipate heat within an electronic device, and the at least one airflow guide is configured to pivot about an axis to move between a first position to a second position based on a change in a rotational speed of the fan.

17 Claims, 7 Drawing Sheets

(58) Field of Classification Search
CPC ........... H05K 7/20145; H05K 7/20154; H05K 7/20172; H05K 7/20718
See application file for complete search history.

(56) References Cited

U.S. PATENT DOCUMENTS

| | | | |
|---|---|---|---|
| 7,474,528 B1 | 1/2009 | Olesiewicz et al. | |
| 7,813,121 B2 | 10/2010 | Bisson et al. | |
| 8,000,100 B2* | 8/2011 | Kao | G06F 1/206 |
| | | | 165/104.33 |
| 8,149,578 B2* | 4/2012 | Neumann | G06F 1/20 |
| | | | 361/690 |
| 8,228,571 B2* | 7/2012 | Beegle | H04N 1/00519 |
| | | | 358/471 |
| 8,305,752 B2* | 11/2012 | Ke | G06F 1/20 |
| | | | 165/80.2 |
| 8,356,656 B2 | 1/2013 | Chang et al. | |
| 8,395,892 B2* | 3/2013 | Li | H05K 7/20727 |
| | | | 165/80.3 |
| 8,605,427 B2 | 12/2013 | Chen et al. | |
| 9,058,159 B2* | 6/2015 | Lee | G06F 1/20 |
| 9,389,655 B2 | 7/2016 | Wu et al. | |
| 9,832,912 B2* | 11/2017 | Klein | F16K 3/0209 |
| 10,244,666 B2* | 3/2019 | Tsai | G06F 1/20 |
| 2009/0016019 A1* | 1/2009 | Bandholz | G06F 1/20 |
| | | | 361/695 |
| 2011/0250047 A1* | 10/2011 | June | F04D 29/422 |
| | | | 415/1 |
| 2011/0250048 A1* | 10/2011 | June | F04D 29/422 |
| | | | 415/1 |
| 2011/0250049 A1* | 10/2011 | June | F04D 29/422 |
| | | | 415/1 |
| 2014/0016268 A1 | 1/2014 | Tsujimura et al. | |
| 2014/0318648 A1* | 10/2014 | Tang | H05K 7/20145 |
| | | | 137/565.29 |
| 2018/0095508 A1* | 4/2018 | Yi | G06F 1/20 |
| 2018/0356112 A1* | 12/2018 | Lin | G06F 1/20 |

\* cited by examiner

ADAPTIVE AIRFLOW GUIDES IN AN ELECTRONIC DEVICE

BACKGROUND

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform efficiently. When overheating, electronic devices run slowly. This can lead to eventual device failure and reduced service life.

As computing devices get smaller (e.g., thinner), thermal management becomes more of an issue. Heat will be dissipated from a computing device by convection, conduction and radiation. For a forced convection computing device, it may include one or more fans used to move air through the computing device and cool one or more heat generating components of the computing device.

Thermal management systems may use sensors to track temperatures within the computing device (e.g., corresponding to heat generating components within the computing device) and increase a speed of one or more of the fans when a tracked temperature approaches a temperature limit of the corresponding component within the computing device. Once fan speeds reach limits, airflow through the computing device is maximized, and one or more of the heat generating components within the computing device are throttled. In other words, system performance is reduced to maintain all temperatures within the computing device within limits. Further, the fan consumes more power when operating at the increased speed, and the increased fan speeds create a noisier thermal management system from, for example, moving fan blades and motor spinning/vibration; this results in a noisier computing device.

System impedance is a parameter of the computing device that impacts both cooling capacity and system noise. The higher the system impedance, the less airflow the fans of the computing device may provide. Less airflow leads to higher component and skin temperatures. To obtain a same airflow in a first computing device (e.g., a high impedance system) compared to a second computing device with a lower system impedance (e.g., a low impedance system), higher fan speeds are needed. This results in higher system noise compared to the second computing device.

SUMMARY

Adaptive airflow guides and electronic devices including such airflow guides are described herein. In one or more embodiments, a thermal management system includes a fan configured to move air through an outlet opening of the fan; and at least one airflow guide positioned adjacent to the outlet opening, wherein the at least one airflow guide is configured to direct movement of the air from the outlet opening to dissipate heat within an electronic device, and wherein the at least one airflow guide is configured to move between a first position to a second position based on a change in a rotational speed of the fan.

In another embodiment, a computing device includes a temperature sensor configured to measure an operating temperature of the computing device or a heat generating component of the computing device; a fan configured to move air through an outlet opening of the fan; at least one airflow guide positioned adjacent to the outlet opening of the fan, wherein the at least one airflow guide is configured to direct movement of the air from the outlet opening to dissipate heat within the computing device; and a processor in communication with the temperature sensor and the at least one airflow guide, wherein the processor is configured to adjust a rotational speed of the fan based on the measured operating temperature and adjust the position of the at least one airflow guide based on a change in the rotational speed of the fan.

In another embodiment, a method is provided for operating a computing device having a fan and at least one airflow guide positioned adjacent to an outlet opening of the fan. The method includes measuring, by a temperature sensor of the computing device, an operating temperature of the computing device or a heat generating component of the computing device; adjusting, by a processor of the computing device, a rotational fan speed of the fan based on the measured operating temperature; and adjusting, by the processor, a position of the at least one airflow guide based on the adjusted rotational fan speed to direct movement of air from the outlet opening and dissipate heat within the computing device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
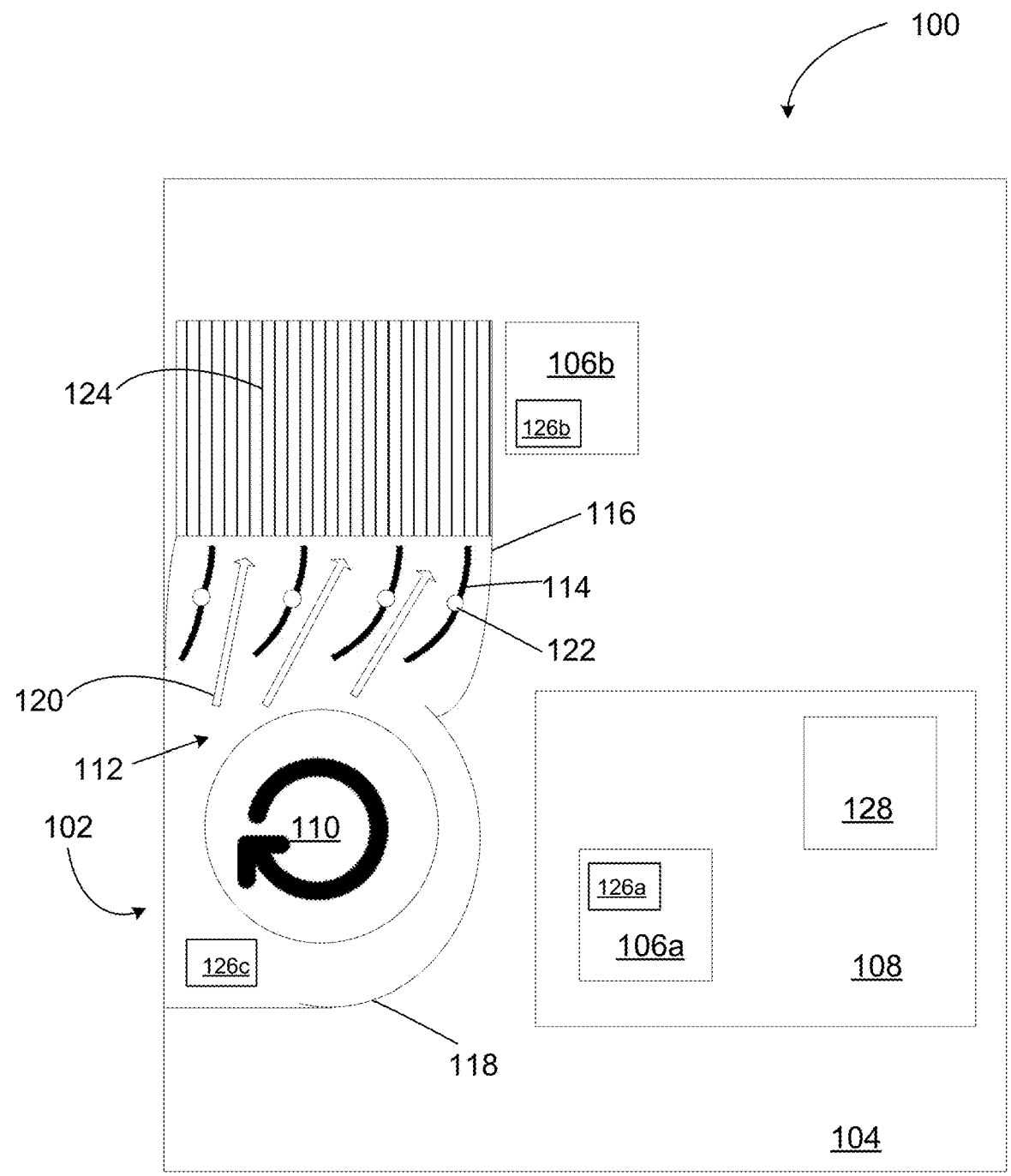
FIG. 1 depicts a top view of a thermal management system within a chassis of a computing device.

While the disclosed devices, systems, and methods are representative of embodiments in various forms, specific embodiments are illustrated in the drawings (and are hereafter described), with the understanding that the disclosure is intended to be illustrative and is not intended to limit the claim scope to the specific embodiments described and illustrated herein.

DETAILED DESCRIPTION

Disclosed herein are apparatuses, systems, and methods for adaptively moving airflow guides in a computing device to control airflow through the computing device to provide optimal thermal management. To optimize (e.g., lower) the system impedance and minimally impact industrial design (ID) of the computing device, airflow guides may be moved between different positions based on one or more monitored operating conditions (e.g., temperature and/or fan speed) of the computing device.

An adaptive airflow guide may be utilized to change the system impedance based on a configuration or mode of the computing device by moving, rotating, pivoting, and/or sliding the airflow guide within a housing or chassis of the computing device using mechanical and/or electromechanical mechanisms.

As an example of operation of the adaptive airflow guides in particular configurations of the computing device, one or more thermal sensors may identify an operating temperature of the computing device. A fan speed may be set based on the identified operating temperature to meet the demanded cooling capability. Additionally, based on the rotational fan speed, one or more airflow guides may be adjusted to adapt to the airflow configuration for the specific fan speed. Upon further operation of the computing device, one or more thermal sensors may detect a second, different (e.g., lower or higher) operating temperature. In an effort to efficiently cool the computing device, the fan speed may be adjusted (e.g., increased) to meet the new demanded cooling capability. Additionally, based on the change in rotational fan speed, one or more airflow guides may be adjusted to adapt to the airflow configuration for the adjusted (e.g., lower or higher) fan speed.

A thermal management device or system controlled in this way is advantageous in optimizing the path of airflow or reducing impedance from the fan for a plurality of rotational fan speeds. The thermal management device or system having the adaptive airflow guides is also advantageous in optimizing the airflow distribution to a fin pack for more efficient heat exchanging. This is an improvement over an arrangement having fixed airflow guides, wherein an optimized airflow may only be possible for one fan speed (e.g., a maximum fan speed) because the airflow guides are fixed in place to optimally control airflow pattern for that specific speed, but not for other rotational fan speed settings.

In other words, the thermal management devices and systems, and computing devices including such devices and systems disclosed herein, may be advantageous in providing optimal thermal management for the computing device and/or minimizing acoustics in the computing device for a plurality of rotational fan speeds. Additionally, optimal thermal management may provide an increase in system performance and an increase in computing device life expectancy.

Such thermal management devices and systems have several potential end-uses or applications, including any electronic or computing device with a heat generating component configured to be cooled. For example, the thermal management system may be incorporated into computing devices such as personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the thermal management system may be incorporated within a wearable electronic device configured to be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, the electronic device may be operated at a higher power for a longer period of time, fans may be operated at a lower speed, or any combination thereof may be provided when compared to a similar electronic device without one or more of the improved heat dissipation features. In other words, the heat dissipation features described herein may provide improved thermal management for an electronic device such as a mobile phone, tablet computer, or laptop computer.

FIG. 1 depicts a top view of a computing device 100 including an example of a thermal management system 102. The computing device 100 may be any number of computing devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, an audio and/or video media player, or wearable electronic device.

The computing device 100 includes a chassis 104 that supports or houses at least the thermal management system 102 and one or more heat generating components 106a, 106b. The one or more heat generating components 106a, 106b may be any number of electrically powered devices including, for example, a processor, a graphics card, memory, a power supply, a hard drive, or another electrically powered device. The one or more heat generating components 106a, 106b may be supported by the chassis 104 via, for example, a printed circuit board (PCB) 108 attached to and/or supported by the chassis 104. The one or more heat generating components 106a, 106b are in communication with each other and/or other electrical devices or components (e.g., fans) of the computing device 100 via the PCB 108, for example. The computing device 100 may include a number of components not shown in FIG. 1 (e.g., a hard drive, a power supply, connectors).

Two heat generating components (e.g., first heat generating component 106a and second heat generating component 106b) are shown in the example of FIG. 1. More or fewer heat generating components may be included in the computing device 100. In one example, the heat generating component 106a is a processor and the heat generating component 106b is a graphics card. In other examples, one or more of the heat generating components 106a and 106b represent different components within the computing device 100 (e.g., a hard drive, a power supply, or another processor).

The thermal management system 102 includes one or more active cooling devices 110 (e.g., a centrifugal fan) to actively cool the one or more heat generating components 106a, 106b, respectively. The cooling device 110 includes an inlet opening to receive air and an outlet opening 112 to transfer or move air out of the computing device 100.

As used herein, "active cooling" may refer to the use of forced fluid or gas movement (e.g. fans moving air) to dissipate the heat of a component (e.g., a microprocessor) of the computing device. Active cooling contrasts with "passive cooling," which utilizes non-forced methods of cooling such as natural convection and radiation.

In the example depicted in FIG. 1, the one or more active cooling devices 110 includes one or more fans. The one or more fans 110 are in communication with at least one of the heat generating components 106a, 106b and/or another heat generating component. The one or more fans 110 may be one or more centrifugal fans. The one or more fans 110 may rotate on any number of types of bearings including, for example, sleeve bearings, rifle bearings, ball bearings, fluid bearings, magnetic bearings, or another type of bearing. The one or more fans 110 may be sized and may rotate at a speed based on the heat generating component 106a, 106b to be cooled (e.g., based on the heat generated by the heat generating component 106a, 106b to be cooled). While the example of FIG. 1 shows a single fan 110, the computing device 100 may include more fans 110. For example, the thermal management system may include a plurality of centrifugal fans positioned next to one another. Each fan of the plurality of fans may be configured to operate at a same speed as each additional fan, or at different speeds from each additional fan. An example of such a system is discussed in greater detail below (see FIG. 2).

The thermal management system 102 also includes at least one airflow guide 114 positioned adjacent to or downstream of the outlet opening 112 of the fan 110. The at least one airflow guide 114 may be positioned within an air duct housing 116 that is downstream of the outlet opening 112 of the fan 110. The fan and the airflow guides may be positioned within a same housing (i.e., the air duct housing is part of an overall housing containing the fan and the airflow guides). Alternatively, the at least one airflow guide may be positioned in a separate air duct housing 116 that is adjacent to or attached to a fan housing 118.

The at least one airflow guide 114 is configured to direct movement of the air 120 flowing from the outlet opening 112 of the fan 110 to assist in the dissipation of heat within an electronic device 100. A portion of each airflow guide 114 may be connected to or attached to a housing 116, 118 of the thermal management system (or to the chassis 104) such that the airflow guide 114 is configured to move between a plurality of positions based on its attachment or connection to the housing 116, 118 or chassis 104. This is advantageous as the ability to move the airflow guides 114 between different positions, allowing for an optimal airflow pattern for various airflow speeds (based on changes in the rotational speed of the fan).

In examples including a plurality of fans, some or all fans may be connected or linked together such that the connected fans rotate or move together. Alternatively, each fan may be independently connected or attached to the housing or chassis.

In certain examples, at least one airflow guide 114 may be connected to or attached at a pivot point 122 to the fan housing 116, 118 or chassis 104 of the computing device 100, such that the airflow guide 114 may rotate or pivot about the pivot point 122. The airflow guide 114 may be connected via a mechanical or electromechanical gear that is controllable by the processor 106a to rotate the airflow guide 114 about the pivot point 122. In examples having a plurality of airflow guides, the airflow guides 114 may be connected together and controlled by a same mechanical or electromechanical gear such that the processor may rotate the plurality of airflow guides together via a single mechanism. In other examples, an individual gear or mechanism may be provided for each individual airflow guide so that each airflow guide 114 may be independently adjusted or rotated about their respective pivot point 122.

In some examples, one portion of the airflow guide may be connected or attached at a pivot point to a housing or chassis, and a separate portion of the airflow guide may be connected to a sliding component positioned within a groove of the housing or chassis, such that a processor may control movement of the sliding component, wherein the airflow guide then rotates about its pivot point.

In an alternative example, a portion of an airflow guide may be positioned within a groove in the housing or chassis, such that the airflow guide may slide within the groove to move between different positions. In other words, the airflow guide may be connected to the housing or chassis via a sliding mechanism controllable by the processor to slide the airflow guide between different positions within the groove of the housing or chassis. In examples having a plurality of airflow guides, each airflow guide may have a portion of the airflow guide positioned within the same groove such that the airflow guides are connected together and slide together within the groove to move between different positions. In other examples, a groove and sliding mechanism may be provided for each individual airflow guide so that each airflow guide may be independently adjusted or moved within their respective groove.

The number of airflow guides 114 may be dependent on the size of the fan and/or the complexity of the airflow patterns generated by the fan at different rotational fan speeds. In some examples, the at least one airflow guide includes a plurality of airflow guides. The example of FIG. 1 depicts four airflow guides. In other examples, the computing device 100 includes more or fewer airflow guides.

The shape of each airflow guide is also configurable to effectively distribute air toward a heat dissipating device (as discussed below) (e.g., to evenly distribute air to the airflow channels of a fin pack). In some examples, the configuration or shape of an airflow guide is dependent on the shape of the housing and the airflow guide's location within the housing, as well as the potential airflow pattern within the area of the housing for various fan speeds. For instance, the shape of one airflow guide may be linear in shape in one area of the housing, while the shape of a second airflow guide may be curved in a second area of the housing based on the potential airflow patterns within the respective areas of the housing.

The location of movement of each airflow guide is also configurable. For example, as depicted in FIG. 1, the airflow guides 114 have centrally located pivot points 122 about which each airflow guide 114 may rotate. Alternatively, the pivot point may be located at one end of the airflow guide. Further, in some examples, as discussed above, the airflow guide does not rotate, but slides between different positions to optimize the airflow to the heat dissipating component.

In some examples, the airflow guide 114 is a single piece of material such that the entire airflow guide is configured to rotate, pivot, slide, or otherwise move between different positions. Alternatively, an airflow guide may include a plurality of individual pieces. In such an example, one or more pieces may be configured to move independently from the remaining pieces of the airflow guide to optimize airflow.

The dimensions of each airflow guide 114 are also configurable to optimize airflow and minimize impedance.

The material of each airflow guide 114 is also configurable. In some examples, each airflow guide may be made of any variety of materials such as metals, plastics, polymers, ceramics, or combinations thereof.

The thermal management system 102 may also include a heat dissipating device 124 to aid in the removal of heat from the computing device 100. The heat dissipating device 124 may abut, be attached to, or be adjacent to a heat generating component 106a, 106b to assist in the dissipation of heat from the heat generating component 106a, 106b. For example, the thermal management system 102 may include a heat transfer device (e.g., heat fins, heat pipes, and/or vapor chambers) physically attached or adjacent to a respective heat generating component 106a, 106b and a respective fan 110.

The heat dissipating device 124 may be positioned downstream of the airflow guides 114 such that the airflow guides 114 are positioned between the outlet opening 112 of the fan 110 and the heat dissipating device 124. Airflow 120 generated from the fan 110 is configured to move toward the airflow guides; and the airflow guides are configured to direct the airflow 120 toward the heat dissipating device 124 to assist in the dissipation of heat from the heat generating component 106a, 106b adjacent to the heat dissipating device 124.

In certain examples, the heat dissipating device 124 may include a plurality of heat fins (e.g., a fin pack) having a plurality of airflow channels. The airflow guides 114 may be configured to guide or direct the flow of air 120 from the outlet opening 112 of the fan 110 into the channels of the heat fins to dissipate heat from a heat generating component 106a, 106b of the computing device 100. The efficiency of heat dissipation within the heat fins or fin pack is determined based on the degree of uniformity of air distribution through the airflow channels of the heat fins or fin pack. In other words, the fin pack efficiency is improved through an improved airflow distribution (wherein each airflow channel receives a proper amount of airflow as each additional channel). As disclosed herein, the adaptive airflow guides 114 are advantageous in providing adjusted positions based on different fan speeds to efficiently or uniformly distribute air into the airflow channels of the fin pack for the varying fan speeds.

The thermal management system 102 may include one or more sensors 118 that monitor operating conditions or parameters (e.g., an operating condition) on or in the computing device 100. The at least one heat generating component 106a and/or the other heat generating component 106b is in communication with the one or more sensors. In one example, at least some of the one or more sensors may be any number of different types of temperature sensors including, for example, a thermocouple, a resistance temperature detector (RTD) (e.g., a resistance wire RTD or a thermistor), or another type of temperature sensor. Alternatively, or additionally, the one or more sensors may include a fan tachometer to measure speeds of the one or more fans 110.

As shown in the example of FIG. 1, the thermal management system 102 may include a first sensor 126a configured to monitor an operating temperature corresponding to the first heat generating component 106a, a second sensor 126b configured to monitor an operating temperature corresponding to a second heat generating component 106b, and a third sensor 126c configured to monitor a rotational speed of the fan 110 (as measured in rotations per minute or RPMs). For example, the first sensor 126a monitors an operating temperature of the first heat generating component 106a, and the second sensor 126b monitors an operating temperature of the second heat generating component 106b. The first sensor 126a, the second sensor 126b, and the third sensor 126c are positioned on or adjacent to the first heat generating component 106a, the second heat generating component 106b, and the fan 110, respectively.

In one example, a sensor monitors an operating temperature of the electronic device at a position within the computing device 100 not at or adjacent to one of the heat generating components 106. For example, the sensor may monitor a temperature of a component of the thermal management system 102 (e.g., at a position on a heat transfer device such as a heat pipe) or a temperature on the chassis 104.

All of the sensors within the computing device 100 may provide live closed-loop feedback to the thermal management system 102. For example, the thermal management system 102 includes a processor (e.g., one of the heat generating components 106a, an EC, or another processor within or outside the computing device 100). The processor 106b of the thermal management system 102 is configured to control the movement, rotation, or pivoting the airflow guides 114 based on the operating condition monitored by the one or more sensors. An exemplary discussion of the movement of the airflow guides 114 for different rotational fan speeds is explained in greater detail below for FIGS. 4 and 5.

The processor 106a in FIG. 1, for example, receives the live temperatures from the sensors 126a and 126b and controls the fan 110 and/or the airflow guides 114 based on the methods described below to increase airflow through the computing device and/or decrease impedance and/or improve heat dissipation from the heat dissipating device (e.g., a heat fin pack).

The thermal management system 102 may also include at least one memory 128 in communication with the processor 106. The memory 128 is configured to store operating conditions of the computing device 100, which may be retrieved by the processor 106a during operation of the computing device 100. The operating conditions may provide correlations between operating temperatures and rotational fan speeds. For example, if a temperature sensor 126a, 126b identifies that the operating temperature of the computing device 100 or a heat generating component 106a, 106b of the computing device is at a certain temperature, the rotational fan speed may be adjusted in an effort to efficiently cool the computing device 100. That is, higher measured temperatures may require higher fan speeds to cool the computing device 100, while lower measured temperatures may allow for lower fan speeds to cool the computing device 100 efficiently.

Additionally, or alternatively, the operating conditions stored within the memory may include correlations between the rotational fan speed and an optimal alignment or positioning of each airflow guide 114. As noted above, optimizing the positioning of each airflow guide 114 for a specific fan speed may be advantageous in reducing airflow impedance, improving airflow through the computing device, and improving the heat dissipation or cooling of the heat generating components 106a, 106b of the computing device 100 (e.g., via improved airflow through airflow channels of a heat dissipating device such as a heat fin pack). In other words, the memory 128 may provide the optimized positioning of each airflow guide 114 for a plurality of fan speeds, therein allowing the processor 106a to control the movement of each airflow guide 114 based on an identified rotational fan speed.

The operation conditions stored within a memory 128 of the computing device may be derived through experimental testing or computer simulations, wherein airflow patterns 120 exiting the fan of the computing device 100 are monitored or calculated for a plurality of fan speeds. Based on the airflow profile 120 for a specific fan speed, the optimal positioning of each airflow guide may be determined such that the impedance is minimized, the airflow rate is maximized, and/or the airflow is uniformly distributed to a heat dissipating device for the specific fan speed. The positioning of each airflow guide 114 is then saved or stored within the memory 128 for each defined fan speed.

An exemplary discussion of the positioning of the airflow guides for two different rotational fan speeds is explained in further detail below (see discussion regarding FIGS. 4 and 5).

Figure 2:
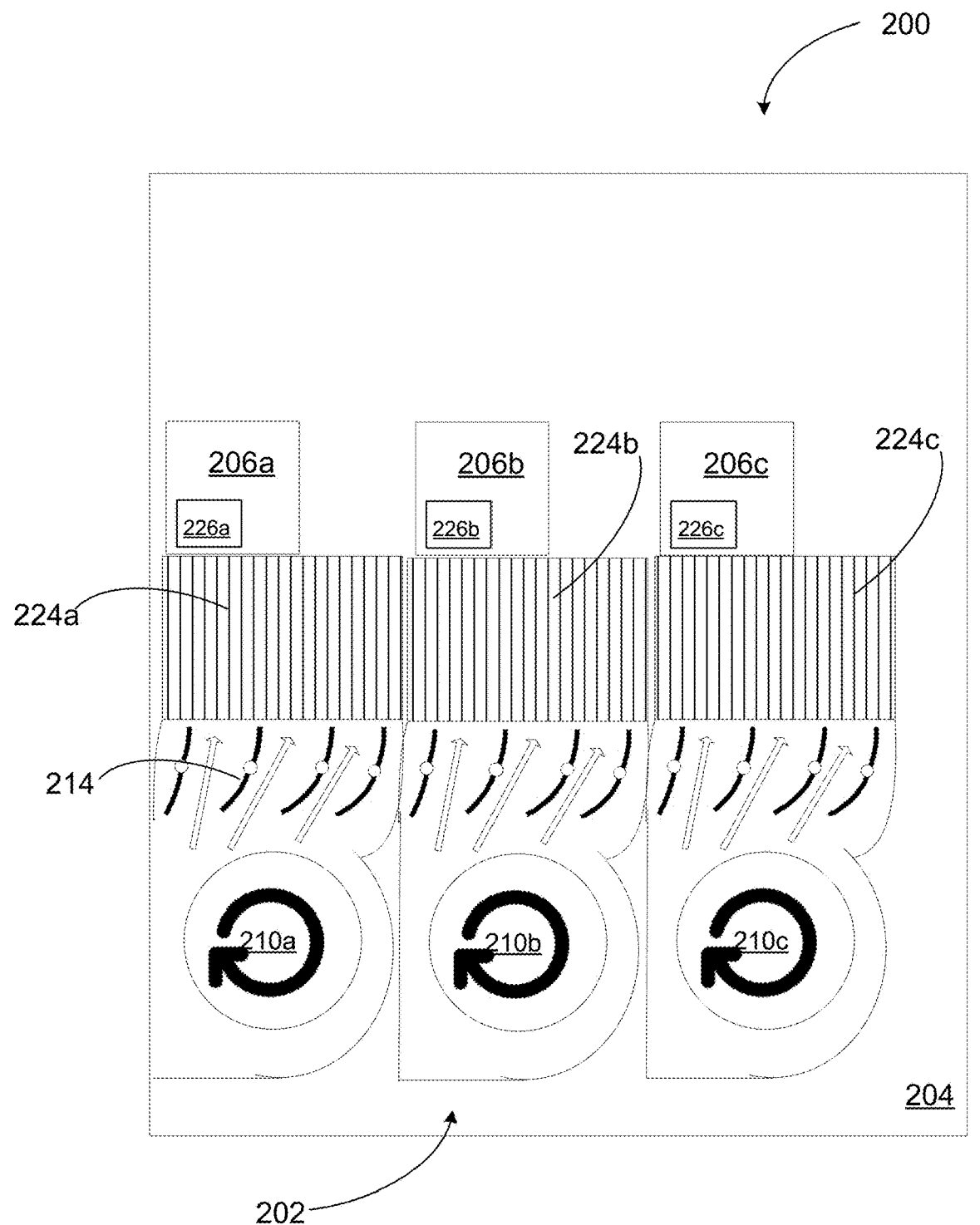
FIG. 2 depicts a top view of a thermal management system having a plurality of fans within a chassis of a computing device.

FIG. 2 depicts a top view of a computing device 200 having a chassis 204 that supports or houses a thermal management system 202 with a plurality of fans 210a, 210b, 210c. The plurality of fans may be a plurality of centrifugal fans.

Each fan of the plurality of fans 210a, 210b, 210c may be positioned within its own housing, or the plurality of fans may share a housing.

Each fan includes at least one air flow guide 214 positioned adjacent to or downstream of the outlet opening of the respective fan. The at least one airflow guide 214 may be positioned within an air duct housing that is downstream of the outlet opening of the fan. The fan and the airflow guides may be positioned within a same housing (i.e., the air duct housing is part of an overall housing containing the fan, or plurality of fans, and the airflow guides). Alternatively, the at least one airflow guide may be positioned in a separate air duct housing that is adjacent to or attached to a fan housing.

The plurality of fans may be associated with a heat dissipating device or a plurality of heat dissipating devices 224a, 224b, 224c to aid in the removal of heat from the computing device 200. The heat dissipating device or plurality of heat dissipating devices 224a, 224b, 224c may abut, be attached to, or be adjacent to a heat generating component 206a, 206b, 206c to assist in the dissipation of heat from the heat generating component 206a, 206b, 206c. For example, the thermal management system 202 may include a plurality of heat transfer devices (e.g., heat fins, heat pipes, and/or vapor chambers) physically attached or adjacent to a respective heat generating component 206a, 206b, 206c and a respective fan 210a, 210b, 210c.

Each fan of the plurality of fans 210a, 210b, 210c may be configured to operate at a same speed as each additional fan, or at different speeds from each additional fan.

Each fan and the associated airflow guide(s) may be adjusted individually to optimize the thermal management in a specific location and for specific component(s). All the plurality of fans and the associated airflow guides of each fan can be adjusted as a group to maximum the performance of the whole thermal management system.

For example, the heat generating component 206a may be operating at a high temperature (as identified by sensor 226a), while the heat generating components 206b and 206c may be operating at lower temperatures (as identified by sensors 226b, 226c). As such, the fan 210a may be instructed to operate at a high speed, while fans 210b and 210c operate at lower speeds. Additionally, the airflow guides associated with fan 210a may be adjusted to positions for the high rotational fan speed, while the airflow guides associated with fans 210b and 210c are adjusted to positions associated with lower rotational fan speeds.

Figure 3:
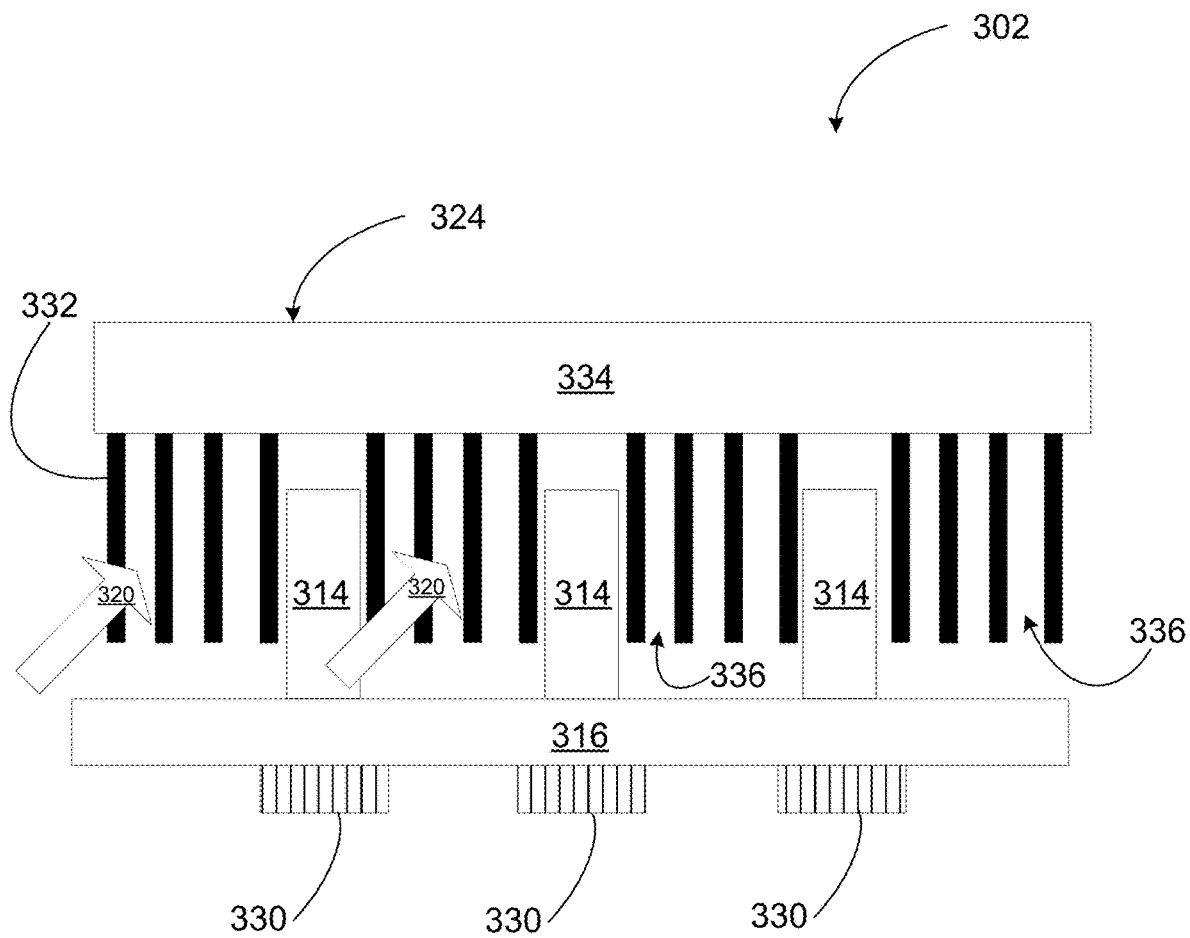
FIG. 3 depicts a side view of an airflow guide of a thermal management system.
Figure 3:
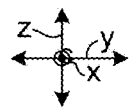

FIG. 3 depicts a side view of a portion of a thermal management system 302. In this example, the thermal management system 302 includes a plurality of airflow guides 314, a housing 316 (e.g., an air duct housing or fan housing), a heat dissipating device 324, and mechanical gears 330 attaching each airflow guide 314 to the housing 316 at a pivot point.

As discussed above, the airflow guides 314 are configured to direct airflow 320 from an outlet of a fan of the computing device toward the heat dissipating device 324 to cool the computing device or a heat generating component of the computing device. In this example, the heat dissipating device 324 includes a plurality of heat fins 332. The heat fins 332 are attached to or extend from a base 334 of the heat dissipating device, which may be positioned adjacent to or abut the heat generating component (e.g., a processor). The heat dissipating device 324 includes a plurality of airflow channels 336 positioned between adjacent fins 332, wherein the air 320 from the fan is moved through the airflow channels 336 to remove or dissipate heat from the heat generating device.

The airflow guides 314 are positioned with a cavity of a housing 316 (e.g., part of the fan housing or a separate air duct housing). The airflow guides 314 are attached to the housing at a pivot point such that the airflow guides 314 are configured to rotate or move about an axis of the pivot point. The airflow guides 314 are connected to mechanical gears 330 positioned on an opposite surface of the housing 316, wherein the mechanical gears 330 are controlled by a processor of the computing device to rotate the airflow guides 314.

As noted above, each airflow guide may be independently controlled or moved by the processor for an identified fan speed, or the airflow guides may be collectively controlled to move or rotate together for the identified fan speed. Additionally, as noted above, alternative mechanisms may be employed within the computing device to move, rotate, or slide the airflow guides between different positions within a cavity of the housing.

Figure 4:
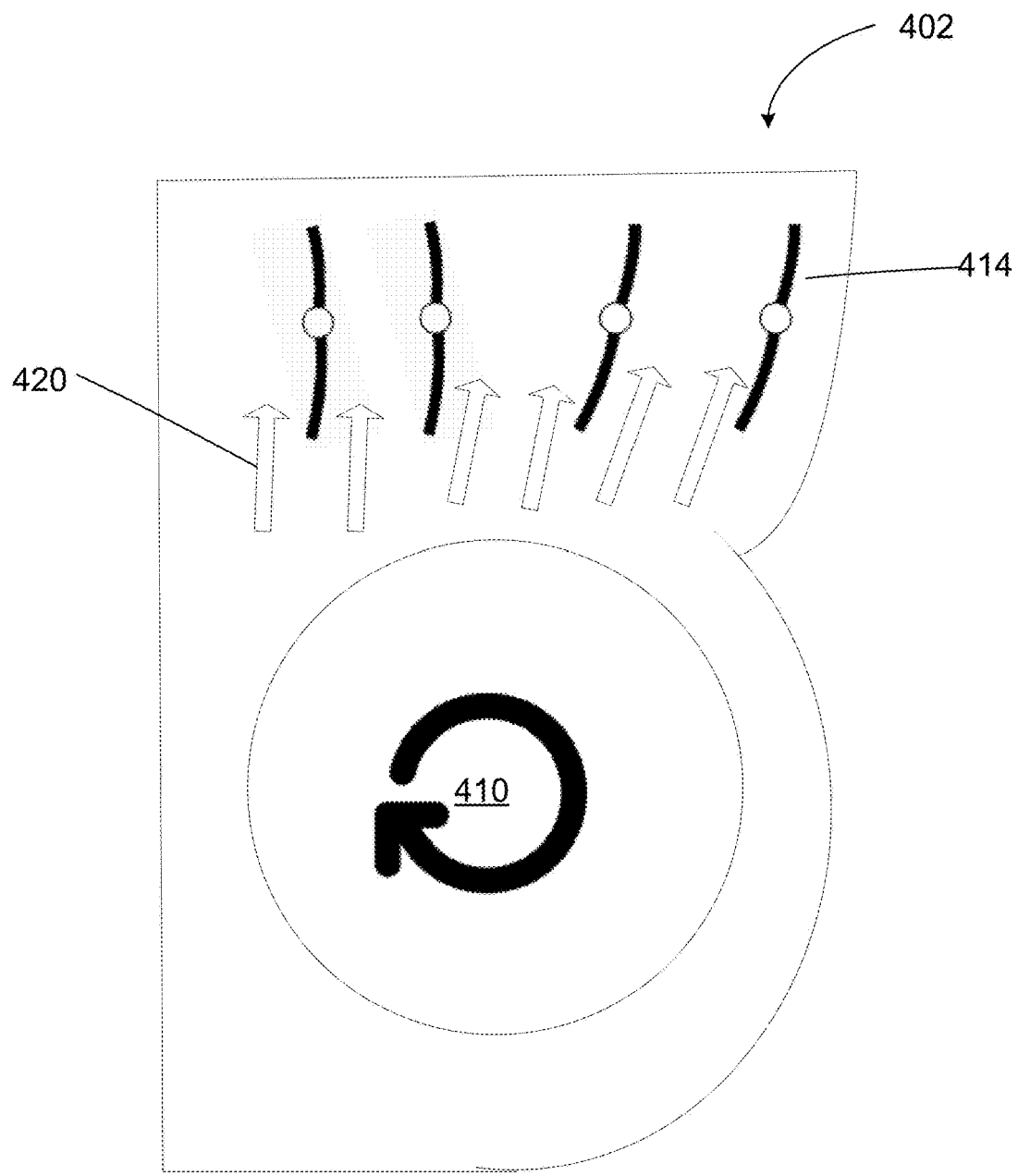
FIG. 4 depicts a top view of a thermal management system having a fan operated at a first rotational speed.
Figure 4:
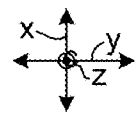

FIG. 4 depicts a top view of a thermal management system 400 having a fan 410 operated at a first rotational speed. In this example, a temperature sensor has identified that the operating temperature of the computing device or a component of the computing device is at, for example, 30° C. Based on this operating temperature, the processor provides instructions to the fan 410 to rotate at a low rotational speed setting (e.g., 1000 RPMs). The airflow guides 414 are positioned based on the low fan speed from the outlet opening of the fan to optimize the flow rate and minimize impedance. As noted above, the positioning of the airflow guides 414 may be based on a known airflow pattern 420 at a specific rotational fan speed (as determined through experimentation or simulation).

Figure 5:
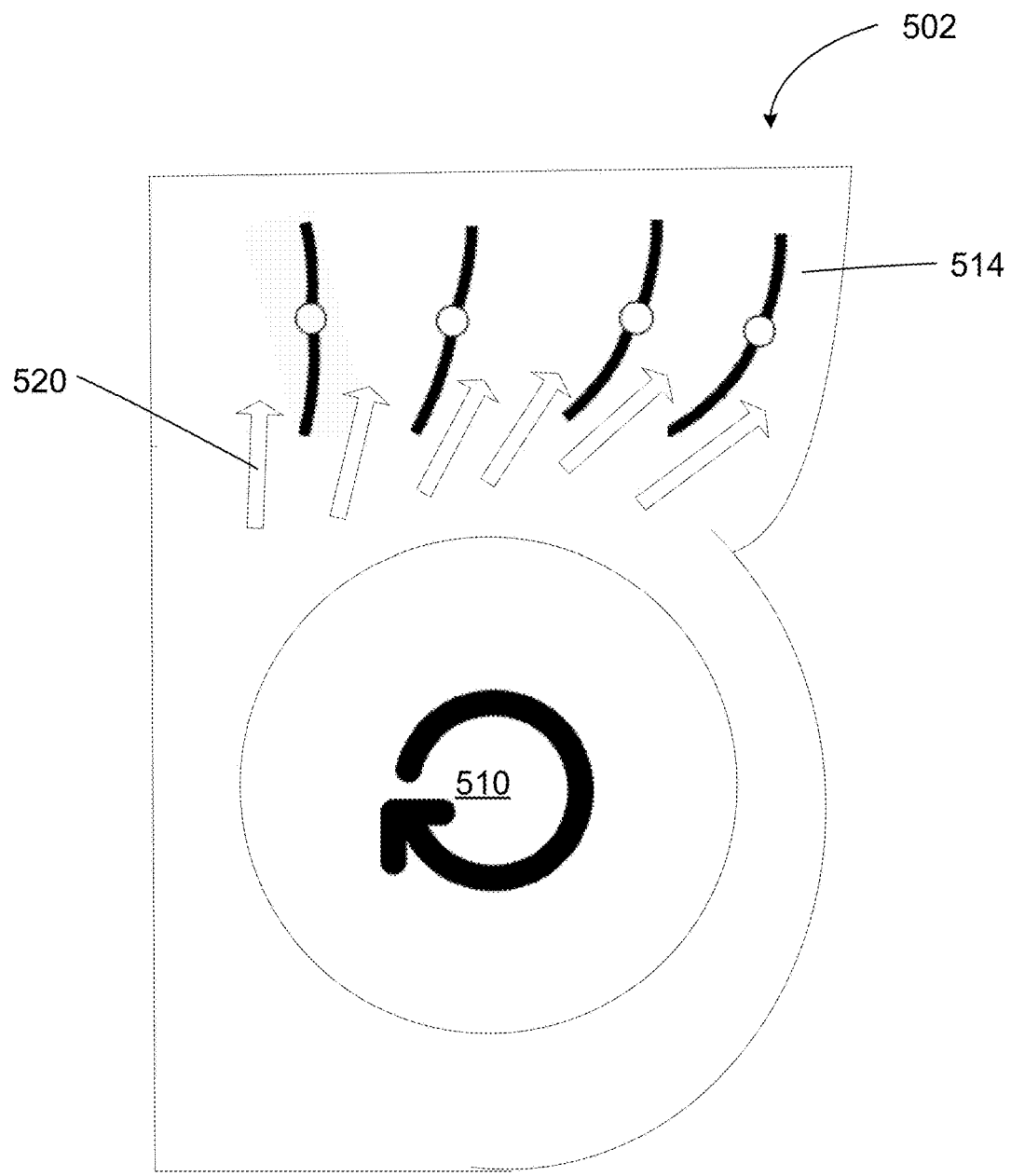
FIG. 5 depicts a top view of a thermal management system having a fan operated at a second rotational speed.

FIG. 5 depicts a top view of a thermal management system 502 having a fan 510 operated at a second rotational speed. In this example, a temperature sensor has identified that the operating temperature of the computing device or a component of the computing device is at a higher temperature, for example, 40° C. (than the operating temperature for the example in FIG. 4). Based on this higher operating temperature, the processor provides instructions to the fan 510 to rotate at a higher rotational speed setting (e.g., 2000 RPMs) to dissipate more heat from the computing device. Further, based on the higher fan speed, the airflow pattern 520 exiting the fan and moving in the direction of the heat dissipating components is different than the lower fan speed in FIG. 4. As such, based upon a known airflow pattern 520 for the higher fan speed (as determined through experimentation or simulation), the airflow guides 514 are adjusted to optimize the airflow rate and minimize impedance for the higher fan speed.

Figure 6:
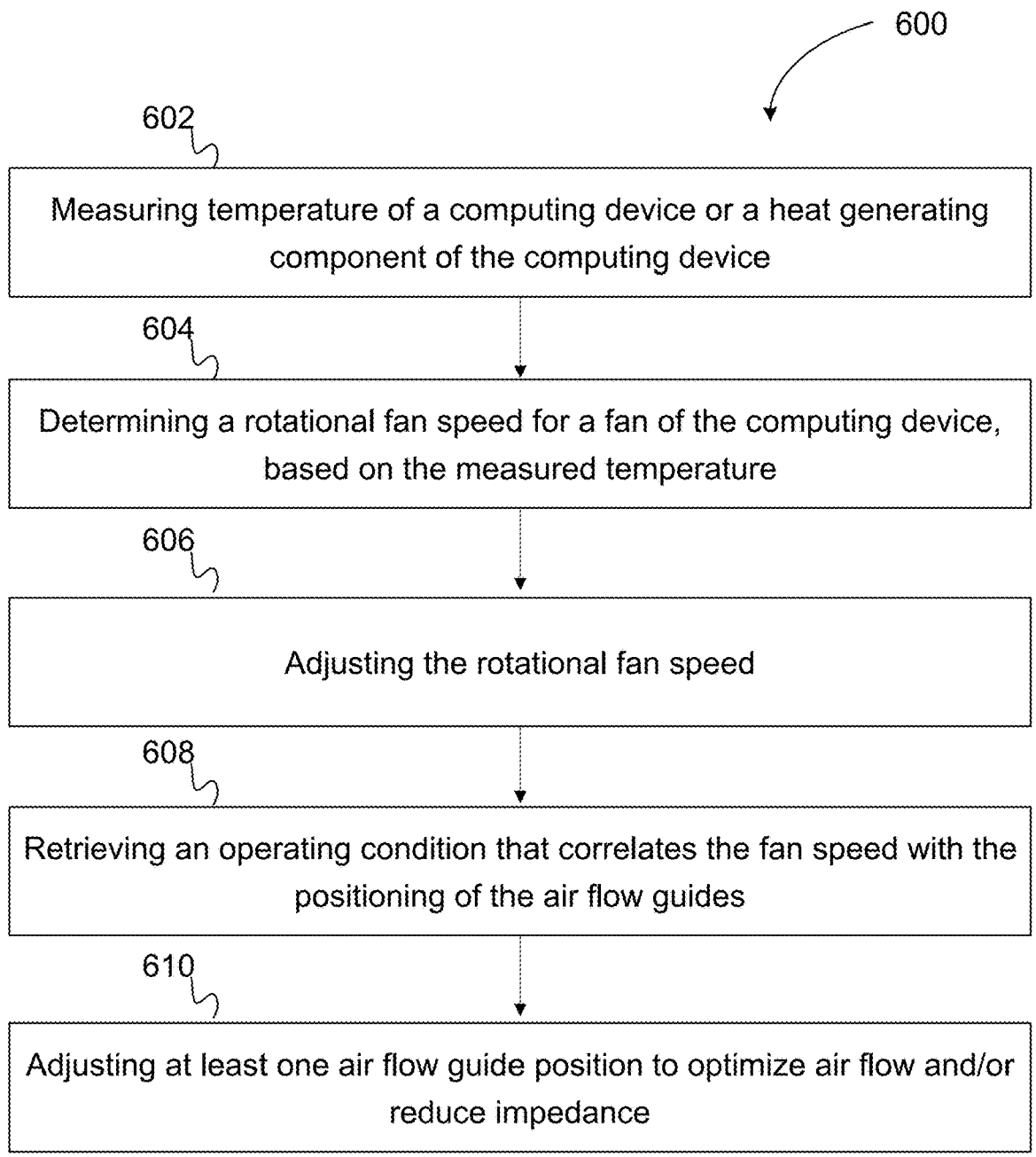
FIG. 6 is a flow diagram of a method for operating an electronic device in accordance with one example.

FIG. 6 is a flow diagram of a method for operating an electronic device in accordance with one example. The method 600 is an example of a method for cooling an electronic device based on a monitored temperature on or within the electronic device. The electronic device may be a computing device shown in FIGS. 1-5 and/or FIG. 7 or may be another electronic device. The method 700 is implemented in the order shown, but other orders may be used. Additional, different, or fewer acts may be provided. Similar methods may be used for transferring heat.

In act 602, one or more sensors measure a temperature within or on the electronic device. The temperature may be an operating temperature of the device or a heat generating component of the device. As noted above, the electronic device may be any number of electronic devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, an audio and/or video media player, or a wearable electronic device.

The electronic device includes one or more heat generating components or devices to be cooled. For example, the one or more heat generating devices may be any number of electrically powered devices including, for example, a processor, memory, a power supply, a graphics card, a hard drive, or another electrically powered device. The electronic device may also include one or more fans to actively cool the electronic device.

In act 604, a processor determines what rotational fan speed should be used based on the measured temperature. The processor may retrieve an operating condition from a memory of the computing device, where the operating condition provides a correlation between the monitored temperature and the rotational speed of the fan. For example, if the identified temperature has reached or exceeded (e.g., is greater than, or greater than or equal to) a predetermined temperature, the operating conditions within the memory of the computing device may provide instructions to increase the fan speed to dissipate the increasing heat within the computing device. Alternatively, the operating conditions may indicate that a specific fan speed should be used when the monitored temperature is within a specific temperature range. That is, the memory may store correlations between specific fan speeds and operating temperature ranges.

In act 606, the processor may provide instructions to adjust the rotational fan speed of the fan based on the measured operating temperature condition. The instructions may be based on the operating conditions retrieved from the memory in act 604.

In act 608, the processor retrieves an operating condition from a memory of the computing device that provides a correlation between the rotational speed of the fan and an optimized position of each airflow guide. As noted above, the correlation may be derived from experimental testing or simulations to determine the position of each airflow guide to optimize airflow and minimize impedance.

In act 610, the processor may provide instructions to adjust the position of at least one airflow guide based on the adjusted rotational fan speed to direct movement of air from the outlet opening and dissipate heat within the computing device.

The examples of the method described with reference to FIG. 5 may provide optimal thermal management in electronic devices. As identified herein, optimal thermal management may provide an increase in system performance, an increase in system and/or device life expectancy, and an improved financial margin.

Figure 7:
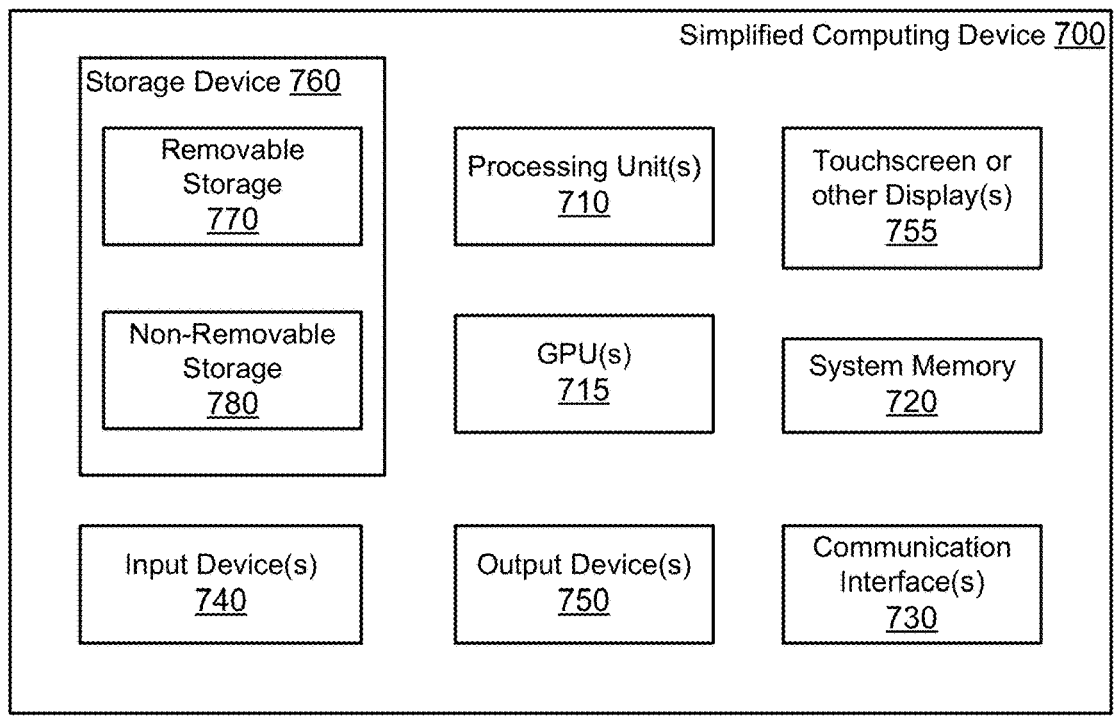
FIG. 7 is a block diagram of a computing environment in accordance with one example for implementation of the disclosed methods or one or more electronic devices.

Regarding FIG. 7, the devices described above may be incorporated within an exemplary computing environment 700. The computing environment 700 may correspond with one of a wide variety of electronic or computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the computing device may be a wearable electronic device, wherein the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

The computing environment 700 has sufficient computational capability and system memory to enable basic computational operations. In this example, the computing environment 700 includes one or more processing unit(s) 710, which may be individually or collectively referred to herein as a processor. The computing environment 700 may also include one or more graphics processing units (GPUs) 715. The processor 710 and/or the GPU 715 may include integrated memory and/or be in communication with system memory 720. The processor 710 and/or the GPU 715 may be a specialized microprocessor, such as a digital signal processor (DSP), a very long instruction word (VLIW) processor, or other microcontroller, or may be a general-purpose central processing unit (CPU) having one or more processing cores. The processor 710, the GPU 715, the system memory 720, and/or any other components of the computing environment 700 may be packaged or otherwise integrated as a system on a chip (SoC), application-specific integrated circuit (ASIC), or other integrated circuit or system.

The computing environment 700 may also include other components, such as, for example, a communications interface 730. One or more computer input devices 740 (e.g., pointing devices, keyboards, audio input devices, video input devices, haptic input devices, or devices for receiving wired or wireless data transmissions) may be provided. The input devices 740 may include one or more touch-sensitive surfaces, such as track pads. Various output devices 750, including touchscreen or touch-sensitive display(s) 755, may also be provided. The output devices 750 may include a variety of different audio output devices, video output devices, and/or devices for transmitting wired or wireless data transmissions.

The computing environment 700 may also include a variety of computer readable media for storage of information such as computer-readable or computer-executable instructions, data structures, program modules, or other data. Computer readable media may be any available media accessible via storage devices 760 and includes both volatile and nonvolatile media, whether in removable storage 770 and/or non-removable storage 780. Computer readable media may include computer storage media and communication media. Computer storage media may include volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium, which may be used to store the desired information, and which may be accessed by the processing units of the computing environment 700.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

Claim Support Section

In a first embodiment, a thermal management system includes a fan configured to move air through an outlet opening of the fan; and at least one airflow guide positioned adjacent to the outlet opening, wherein the at least one airflow guide is configured to direct movement of the air from the outlet opening to dissipate heat within an electronic device, and wherein the at least one airflow guide is configured to move between a first position to a second position based on a change in a rotational speed of the fan.

In a second embodiment, a computing device includes a temperature sensor configured to measure an operating temperature of the computing device or a heat generating component of the computing device; a fan configured to move air through an outlet opening of the fan; at least one airflow guide positioned adjacent to the outlet opening of the fan, wherein the at least one airflow guide is configured to direct movement of the air from the outlet opening to dissipate heat within the computing device; and a processor in communication with the temperature sensor and the at least one airflow guide, wherein the processor is configured to adjust a rotational speed of the fan based on the measured operating temperature and adjust a position of the at least one airflow guide based on a change in the rotational speed of the fan.

In a third embodiment, with reference to the first or second embodiment, the system or device further includes a housing, wherein the fan and the at least one airflow guide are positioned within the housing.

In a fourth embodiment, with reference to any of embodiments 1-3, the at least one airflow guide is connected to the housing at a pivot point, and the at least one airflow guide is configured to rotate about the pivot point to move between the first position and the second position.

In a fifth embodiment, with reference to any of embodiments 1-4, the system or device further includes a gear or sliding component connected to the at least one airflow guide, wherein the mechanical gear or sliding component is configured to move the at least one airflow guide between the first position to the second position.

In a sixth embodiment, with reference to any of embodiments 1-5, the system or device further includes a heat dissipation device having a plurality of airflow channels, wherein the at least one airflow guide is positioned between the outlet opening and the heat dissipation device, and wherein the at least one airflow guide is configured to direct the movement of the air from the outlet opening through the plurality of airflow channels of the heat dissipation device.

In a seventh embodiment, with reference to the sixth embodiment, the heat dissipation device includes a plurality of heat fins.

In an eighth embodiment, with reference to any of embodiments 1-7, the system or device further includes a temperature sensor configured to measure an operating temperature of the electronic device, wherein the rotational speed of the fan is adjustable based on the operating temperature measured by the temperature sensor.

In a ninth embodiment, with reference to any of embodiments 1-8, the at least one airflow guide includes a plurality of airflow guides.

In a tenth embodiment, with reference to the eighth embodiment, each airflow guide of the plurality of airflow guides is configured to move independently from each additional airflow guide of the plurality of airflow guides.

In an eleventh embodiment, with reference to any of embodiments 1-10, the system or device further includes a memory in communication with the processor, wherein the memory is configured to store operating conditions of the computing device, the operating conditions providing correlations between rotational speeds of the fan and optimized positions of each airflow guide of the at least one airflow guide for each rotational speed of the fan.

In a twelfth embodiment, with reference to any of embodiments 1-11, the system or device further includes a heat dissipation device having a plurality of airflow channels, wherein the at least one airflow guide is positioned between the outlet opening and the heat dissipation device, and wherein the at least one airflow guide is configured to direct the movement of the air from the outlet opening through the plurality of airflow channels of the heat dissipation device.

In a thirteenth embodiment, a method is provided for operating a computing device having a fan and at least one airflow guide positioned adjacent to an outlet opening of the fan. The method includes measuring, by a temperature sensor of the computing device, an operating temperature of the computing device or a heat generating component of the computing device; adjusting, by a processor of the computing device, a rotational fan speed of the fan based on the measured operating temperature; and adjusting, by the processor, a position of the at least one airflow guide based on the adjusted rotational fan speed to direct movement of air from the outlet opening and dissipate heat within the computing device.

In a fourteenth embodiment, with reference to the thirteenth embodiment, the method further includes retrieving, by the processor, an operating condition from a memory of the computing device, the operating condition providing a correlation between a rotational speed of the fan and an optimized position of each airflow guide of the at least one airflow guide, wherein the position of the at least one airflow guide is adjusted based on the retrieved operating condition.

In a fifteenth embodiment, with reference to the thirteenth or fourteenth embodiment, the method further includes retrieving, by the processor, an operating condition from a memory of the computing device, the operating condition providing a first correlation between an operating temperature of the computing device and a rotational speed of the fan and a second correlation between the rotational speed of the fan and an optimized position of each airflow guide of the at least one airflow guide, wherein the rotational fan speed and the position of the at least one airflow guide are adjusted based on the retrieved operating condition.

In a sixteenth embodiment, with reference to any of embodiments 13-15, the at least one airflow guide is positioned between the outlet opening of the fan and a heat dissipation device having a plurality of airflow channels, and the at least one airflow guide directs the movement of the air from the outlet opening through the plurality of airflow channels of the heat dissipation device.

In a seventeenth embodiment, with reference to the sixteenth embodiment, the heat dissipation device includes a plurality of heat fins.

In an eighteenth embodiment, with reference to any of embodiments 13-17, the at least one airflow guide includes a plurality of airflow guides.

The invention claimed is:

1. A thermal management system comprising:
a temperature sensor configured to measure an operating temperature of an electronic device,
a fan configured to move air through an outlet opening of the fan; and
at least one airflow guide positioned adjacent to the outlet opening,
wherein the at least one airflow guide is configured to i) direct movement of the air from the outlet opening to dissipate heat within the electronic device, and ii) move between a first position and a second position based on the measured operating temperature;
retrieving an operating condition from a memory of the thermal management system, the operating condition providing a first correlation between the operating temperature of the computing device and the rotational speed of the fan and a second correlation between the rotational speed of the fan and an optimized position of each airflow guide of the at least one airflow guide, wherein the rotational fan speed and the position of the at least one airflow guide are adjusted based on the retrieved operating condition.

2. The thermal management system of claim 1, further comprising:
a housing,
wherein the fan and the at least one airflow guide are positioned within the housing.

3. The thermal management system of claim 2, wherein:
the at least one airflow guide is connected to the housing at a pivot point, and
the at least one airflow guide is configured to rotate about the pivot point to move between the first position and the second position.

4. The thermal management system of claim 1, further comprising:
at least one of a gear or sliding component connected to the at least one airflow guide, wherein the gear or sliding component is configured to move the at least one airflow guide between the first position and the second position.

5. The thermal management system of claim 1, further comprising:
a heat dissipation device having a plurality of airflow channels,
wherein the at least one airflow guide:
is positioned between the outlet opening and the heat dissipation device, and
is configured to direct the movement of the air from the outlet opening through the plurality of airflow channels of the heat dissipation device.

6. The thermal management system of claim 5, wherein the heat dissipation device comprises a plurality of heat fins.

7. The thermal management system of claim 1, wherein the at least one airflow guide comprises a plurality of airflow guides.

8. The thermal management system of claim 7, wherein each airflow guide of the plurality of airflow guides is configured to move independently from each additional airflow guide of the plurality of airflow guides.

9. A computing device comprising:
a temperature sensor configured to measure an operating temperature of the computing device or a heat generating component of the computing device;
a fan configured to move air through an outlet opening of the fan;
at least one airflow guide positioned adjacent to the outlet opening of the fan, wherein the at least one airflow guide is configured to direct movement of the air from the outlet opening to dissipate heat within the computing device; and
a processor in communication with the temperature sensor and the at least one airflow guide, wherein the processor is configured to adjust a rotational speed of the fan and adjust a position of the at least one airflow guide based on the measured operating temperature;
retrieving, by the processor, an operating condition from a memory of the computing device, the operating condition providing a first correlation between the operating temperature of the computing device and the rotational speed of the fan and a second correlation between the rotational speed of the fan and an optimized position of each airflow guide of the at least one airflow guide, wherein the rotational fan speed and the position of the at least one airflow guide are adjusted based on the retrieved operating condition.

10. The computing device of claim 9, further comprising:
a heat dissipation device having a plurality of airflow channels,
wherein the at least one airflow guide:
is positioned between the outlet opening and the heat dissipation device, and
is configured to direct the movement of the air from the outlet opening through the plurality of airflow channels of the heat dissipation device.

11. The computing device of claim 10, wherein the heat dissipation device comprises a plurality of heat fins.

12. The computing device of claim 9, wherein:
the at least one airflow guide comprises a plurality of airflow guides, and
each airflow guide of the plurality of airflow guides is configured to move independently from each additional airflow guide of the plurality of airflow guides.

13. A method for operating a computing device, the computing device comprising a fan and at least one airflow guide positioned adjacent to an outlet opening of the fan, the method comprising:
measuring, by a temperature sensor of the computing device, an operating temperature of the computing device or a heat generating component of the computing device;
adjusting, by a processor of the computing device, a rotational fan speed of the fan based on the measured operating temperature; and adjusting, by the processor, a position of the at least one airflow guide based on the measured operating temperature to direct movement of air from the outlet opening and dissipate heat within the computing device;

retrieving, by the processor, an operating condition from a memory of the computing device, the operating condition providing a first correlation between the operating temperature of the computing device and the rotational speed of the fan and a second correlation between the rotational speed of the fan and an optimized position of each airflow guide of the at least one airflow guide, wherein the rotational fan speed and the position of the at least one airflow guide are adjusted based on the retrieved operating condition.

14. The method of claim 13, further comprising:

retrieving, by the processor, an operating condition from a memory of the computing device, the operating condition providing a correlation between a rotational speed of the fan and an optimized position of each airflow guide of the at least one airflow guide, wherein the position of the at least one airflow guide is adjusted based on the retrieved operating condition.

15. The method of claim 13, wherein:

the at least one airflow guide is positioned between the outlet opening of the fan and a heat dissipation device having a plurality of airflow channels, and the at least one airflow guide directs the movement of the air from the outlet opening through the plurality of airflow channels of the heat dissipation device.

16. The method of claim 15, wherein the heat dissipation device comprises a plurality of heat fins.

17. The method of claim 13, wherein the at least one airflow guide comprises a plurality of airflow guides.

* * * * *